United States Patent [19]

Shimoyama

[11] Patent Number: 4,673,966
[45] Date of Patent: Jun. 16, 1987

[54] SEMICONDUCTOR INTEGRATED CIRCUIT

[75] Inventor: Hiroyoshi Shimoyama, Amagasaki, Japan

[73] Assignee: Mitsubishi Denki Kabushiki Kaisha, Tokyo, Japan

[21] Appl. No.: 599,065

[22] Filed: Apr. 11, 1984

[30] Foreign Application Priority Data

Apr. 26, 1983 [JP] Japan .................................. 58-74301

[51] Int. Cl.$^4$ ..................... H01L 23/48; H01L 23/52; H01L 25/04
[52] U.S. Cl. ..................................... 357/68; 357/45; 357/75; 357/71; 357/80
[58] Field of Search ....................... 357/68, 45, 75, 80, 357/71

[56] References Cited

U.S. PATENT DOCUMENTS

| | | | |
|---|---|---|---|
| 4,125,854 | 11/1978 | McKenny et al. | 357/45 |
| 4,287,571 | 9/1981 | Chakravarti et al. | 357/45 |
| 4,409,499 | 10/1983 | Zapsisek et al. | 357/45 |
| 4,500,906 | 2/1985 | Ohno et al. | 357/68 |

FOREIGN PATENT DOCUMENTS

| | | | |
|---|---|---|---|
| 0086248 | 5/1984 | Japan | 357/71 |
| 0220949 | 12/1984 | Japan | 357/45 |
| 0012742 | 1/1985 | Japan | 357/45 |

OTHER PUBLICATIONS

"Logic Array"-Gardner, IBM Technical Disclosure Bulletin, vol. 17, No. 6, Nov. 1974.

Primary Examiner—Andrew J. James
Assistant Examiner—S. V. Clark
Attorney, Agent, or Firm—Birch, Stewart, Kolasch & Birch

[57] ABSTRACT

A semiconductor integrated circuit comprising a plurality of blocks the included circuit components, where the blocks are separated from each other in a semiconductor substrate. Wiring is conducted by using horizontal and verticle wirings along the horizontal and vertical lines of an imaginary wiring grid established in a wiring region between the blocks and diagonal wirings are provided in the process of producing the blocks, wherein the diagonal directions are relative to the horizontal and vertical directions of the imaginary wiring grid.

47 Claims, 12 Drawing Figures (A)

(B)

(A)  (B)

(C)

(A)

(B)

(C)

SEMICONDUCTOR INTEGRATED CIRCUIT

FIELD OF THE INVENTION

The present invention relates to a semiconductor integrated circuit, and more particularly to that in which wiring is conducted along an imaginary wiring grid in the wiring region, as is common with Master-Slice LSIs.

BACKGROUND OF THE INVENTION

FIGS. 1(A) and 1(B) show an example of the wiring structure of a conventional Master-Slice LSI. In FIG. 1(A), the numeral 1 indicates a LSI chip composed of a semiconductor substrate. The numerals 2a to 2f indicate gate cells produced in the semiconductor substrate 1. The cells, including silicon-gate MOS transistors or the like, are arranged at predetermined positions and have logic functions. The gate cells 2a to 2f constitute blocks including circuit components, wherein the blocks are provided separately from each other. The numerals 3 and 5 in FIG. 1(B) indicate terminals of the gate cell 2b, and the numeral 4 indicates a terminal of the gate cell 2a. The numeral 6 indicates an imaginary wiring grid established in the wiring region 7 between the gate cell 2a and 2b. The numerals 8 and 9 indicate horizontal wirings along the horizontal lines of the wiring grid 6, both of them comprising a horizontal wiring layer. The numerals 10 to 12 indicate vertical wirings along the vertical lines of the wiring grid 6, all of them comprising a vertical wiring layer formed on an insulating layer (not shown) which is formed on the horizontal wirings 8 and 9. The numerals 13a, 13b, 13c indicate through holes for connecting between the horizontal wiring and the vertical wiring, provided in the insulating layer which is provided between the horizontal and the vertical wiring layer. The vertical and the horizontal wiring layer can be made as a first and a second layer respectively.

In the conventional Master-Slice LSI shown in FIG. 1, wiring is conducted by providing the horizontal wiring 8 and the vertical wirings 10, 11, and providing the through holes 13a and 13b in the insulating layer so as to connect between the terminals 3 and 4 which lie in the same plane of the LSI chip 1 and should be in equal electric potentials. In this case, permissible minimum intervals between the horizontal wirings and between the vertical wirings are determined beforehand caused by a restriction in view of manufacture. So, in this conventional system, it is possible to conduct wiring with considerable ease by an automatic wiring using the imaginarily wiring grid 6 so as to have the permissible minimum intervals described above.

However, there arises a restriction (hereinafter referred to as an "vertical constraints") that the horizontal wiring (hereinafter referred to as a "trunk line") 9 which is to be connected to the upper terminal 5 must be arranged above the trunk line 8 which is to be connected to the lower terminal 4 in order to avoid a short-circuit between the vertical wirings (hereinafter referred to as a "branch line") in a case where the terminals 5 and 4 are located on the same vertical line of the wiring grid 6.

Accordingly, in Master-Slice LSIs, wiring may become quite difficult with the increased number of gate cells because the height of the wiring region 7 between upper and lower gate cells is predetermined. Herein, the height of the wiring region 7 corresponds to the number of horizontal lines of the wiring grid 6.

Furthermore, in FIG. 2, in a case where the terminals 14a and 14b, 15a and 15b are to be connected with each other respectively, and the terminals 14a (or 14b) and 15b (or 15a) are located on the same vertical line of the wiring grid, wiring becomes more difficult caused by the above-mentioned vertical constraints. In greater detail, it is impossible to connect the terminals 14a and 14b and the terminals 15a and 15b by only three wirings respectively in the same manner because if it is tried at least one of the three wirings connecting the terminals 15a and 15b would cross with one of the three wirings connecting the terminals 14a and 14b on the same level.

In such a case, the incapability of wiring caused by the vertical constraints is conventionally resolved by dividing a trunk line into a few pieces as shown in FIGS. 3(A) to (C). In FIGS. 3(A) to (C) the terminals 14a and 14b are connected by three wirings, that is, two vertical wirings 21, 22 and a horizontal wiring 23. On the other hand, the signal terminals 15a and 15b are connected by five wirings, that is, three vertical wirings 24, 25, 26 and two horizontal wirings 27, 28.

However, in a case shown in FIGS. 3(B) and (C), there are disadvantages in that the whole length of the wiring will increase, resulting in increased signal transfer time, and that a new-type difficulty in wiring will arise because the entire wiring 25 and a part of wirings 27, 28 are located outside the rectangular region surrounded by the four terminals 14a, 14b, 15a and 15b. Furthermore, even in the case of FIG. 3(A), there remains a problem that wiring will become difficult with the increased number of gate cells.

OBJECTS AND SUMMARY OF THE INVENTION

One object of the present invention is to solve the difficulty of wiring with the increased wiring density in a semiconductor integrated circuit without any of the above-described disadvantages.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According the present invention, diagonal wirings which can be used for connecting terminals of blocks are provided in the process of producing the blocks, wherein the diagonal directions are relative to the imaginary wiring grid of the wiring region between the blocks.

DETAILED DESCRIPTION OF THE INVENTION

Figure 4:
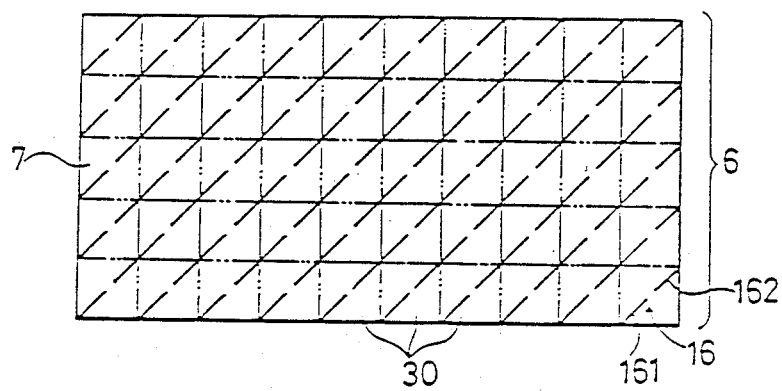
FIG. 4(A) is a plan view of an embodiment of the present invention, and FIGS. 4(B) and (C) are enlarged plan views of FIG. 4(A) in different states respectively.
Figure 4:
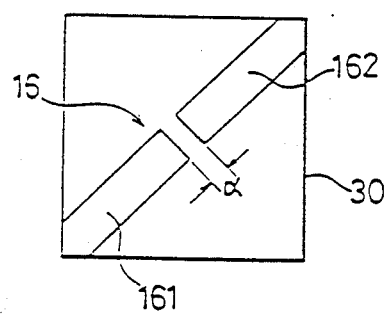
Figure 4:
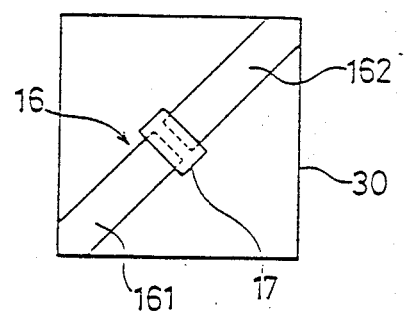

In FIG. 4 which shows an embodiment of the present invention, diagonal wirings 16 are provided in a diagonal direction throughout the whole region of the wiring grid 6. The diagonal wirings 16 and be produced by an impurity diffusion process, producing gate cells at the same time. Furthermore, in a case where silicon gate MOS transistors are produced in gate cells, the wirings 16 can be produced as polysilicon (polycrystalline silicon) layers in the process of producing gate electrodes.

The diagonal wiring 16 in a rectangular frame 30 of the wiring grid 6 is divided into two portions 161 and 162 separated from each other with a permissible minimum distance at the center of the frame 30, and it remains as it is when it is not used as shown in FIG. 4(B). But when it is used as a wiring, a contact 17 is produced at the center of the frame 30 so as to connect the two separated portions 161 and 162. The contact 17 can be produced by providing a contact hole in a corresponding portion of the insulating layer which is formed over the semiconductor substrate, and embedding aluminum in the contact hole in the process of producing a horizontal or a vertical alminum wiring layer as a first layer.

Figure 1:
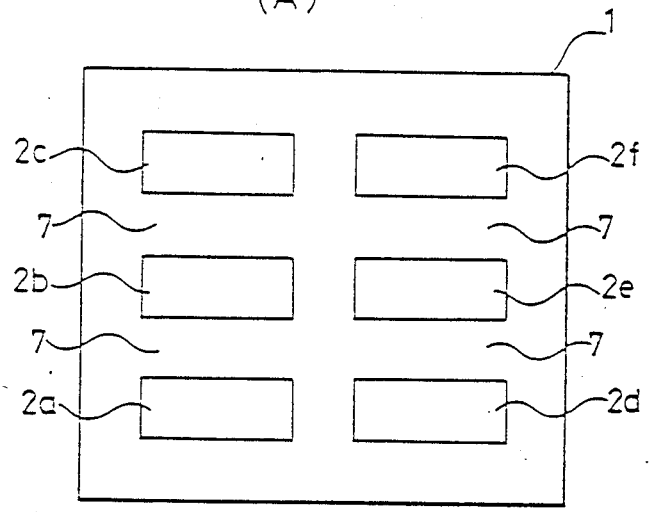
FIGS. 1(A) and (B) are a plan view and a partially enlarged plane view respectively of a conventional Master-Slice LSI.
Figure 1:
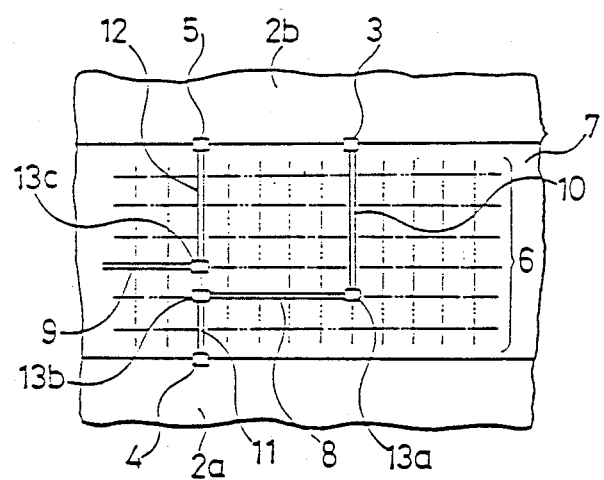
Figure 2:
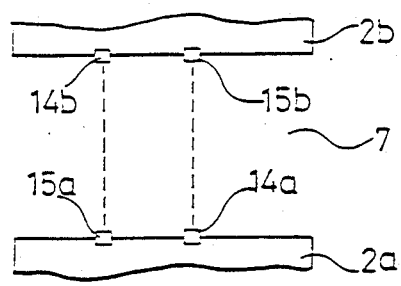
FIG. 2 is a partial plan view of FIG. 1(A)
Figure 3:
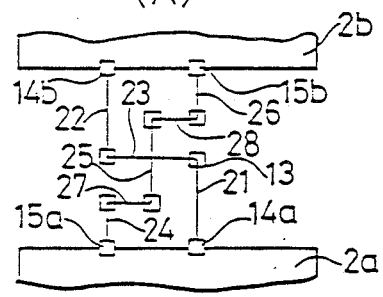
FIGS. 3(A), (B) and (C) are partial plan views of FIG. 1(A) showing conventional wiring methods.
Figure 3:
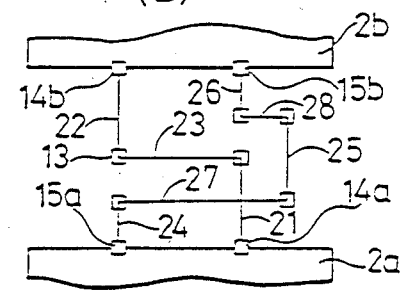
Figure 3:
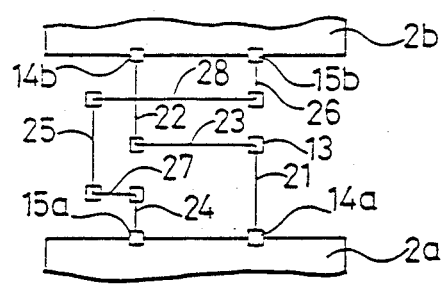
Figure 5:
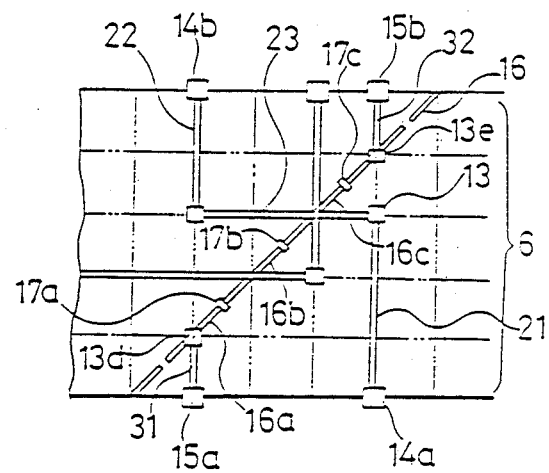
FIG. 5 is a plan view showing a wiring method is the device of FIG. 4.

As shown in FIG. 5, the incapability of wiring caused by the vertical constraints of FIGS. 3(A), 3(B) and 3(C) is resolved by using the diagonal wirings 16. In greater detail, the signal terminals 14a and 14b are connected with each other by two vertical wirings 21, 22 and a horizontal wiring 23 in the same manner as shown in FIG. 3. To the contrary the signal terminals 15a and 15b are connected with each other by two vertical wirings 31, 32 and three diagonal wirings 16a, 16b, 16c. Contacts 17a, 17b, and 17c are provided straddling the two separated portions 161 and 162 of the diagonal wirings 16a, 16b, and 16c respectively so as conductive to facilitate the diagonal wirings as wirings. Through holes 13d and 13e are provided for connecting between the vertical wiring 31 and the diagonal wiring 16a and between the vertical wiring 32 and the diagonal wiring 16c respectively.

By using such diagonal wirings, it is also possible to solve the difficulty of wiring caused when the number of horizontal lines needed for wiring exceeds the number of horizontal lines of the grid.

Figure 6:
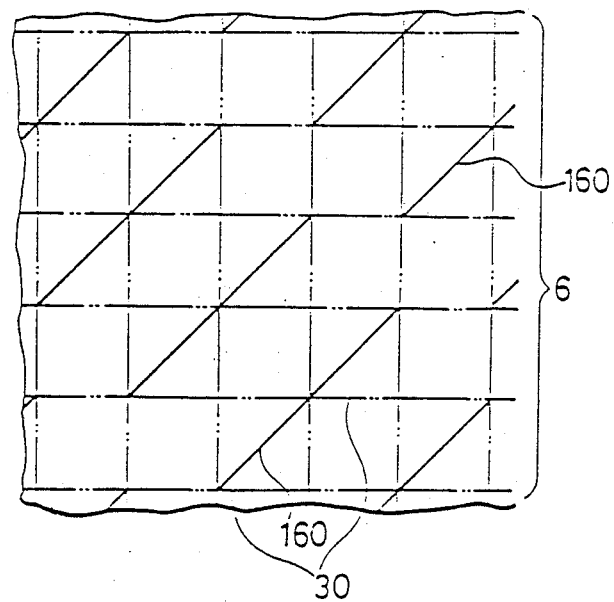
FIG. 6 is a plan view of another embodiment of the present invention.
Figure 7:
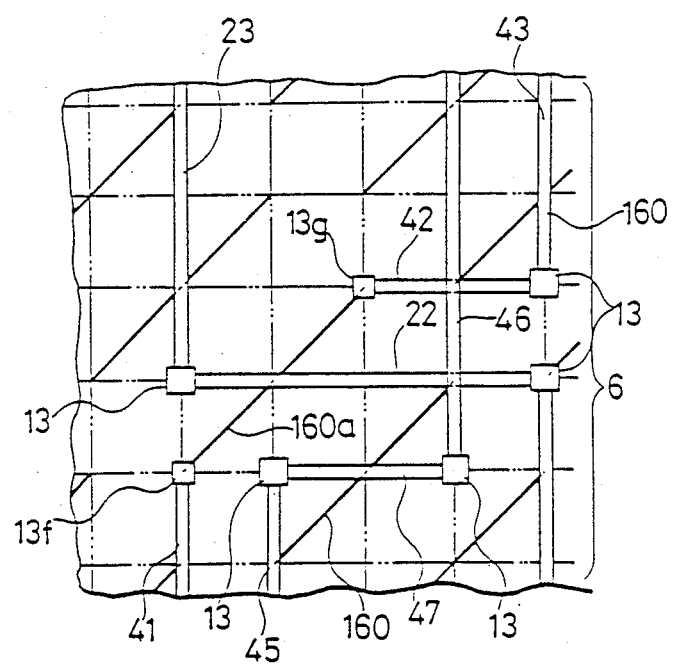
FIG. 7 is a plan view showing a wiring method in the device of FIG. 6.

In FIG. 6 which shows another embodiment of the present invention, the diagonal wirings 160 are arranged systematically straddling two rectangular frames 30 of the wiring grid, and there are provided no separated portions in each diagonal wiring 160, contrary to those shown in FIG. 4. By conducting wiring as shown in FIG. 7, it is possible to solve the incapability of wiring caused by the vertical constraints. That is, a vertical wiring 41 and a horizontal wiring 42 for connecting signal terminals 15a and 15b (not shown in FIG. 7) together with a vertical wiring 43 are connected by a diagonal wiring 160a with contacts 13f, 13g at the both ends thereof. In FIG. 7, two vertical wirings 45, 46 and a horizontal wiring 47 are wirings for connecting other two signal terminals.

The above-discribed embodiments are described in relation to a Master-Slice LSI, but the present invention can be applied to, so-called, building block LSIs. It can also be applied to poly cell, standard cell, or general cell LSIs.

According to the present invention, it is possible to solve the difficulty or incapability of wiring in the region of high wiring density quite easily by providing wirings which are arranged in a diagonal direction relative to the imaginary wiring grid established in a wiring region between the blocks. Furthermore, the production of the diagonal wirings does not give rise to any inconvenience, or increase of manufacturing steps of the device because the diagonal wirings can be produced in the process of producing blocks of circuit components.

What is claimed is:

1. A semiconductor integrated circuit formed on a substrate comprising:

a plurality of circuit cells, each of said circuit cells having a plurality of wiring terminals;

a wiring region disposed between said circuit cells, said wiring region having first and second substantially parallel edges, each said edge being juxtaposed with a said circuit cell, said wiring region being divided into a plurality of rectangular frame portions by a reference field, said reference field including a plurality of first lines, said first lines being substantially parallel to said first and second parallel edges and being equispaced apart, said reference field also including a plurality of second lines, said second lines being equispaced and orthogonally disposed with respect to said first lines, said first and second lines intersecting at a plurality of intersection points, said reference field including a plurality of diagonal lines bisecting said rectangular frame portions, said diagonal lines passing through said intersection points, said diagonal lines being equispaced and parallel;

a first layer of wirings, said first layer of wirings comprising a plurality of diagonal wiring portions, a set of diagonal wiring portions being disposed along each of said diagonal lines, with adjacent colinear diagonal wiring portions in each set of diagonal wiring portions having equal distance gaps therebetween;

gap connector means disposed in selected ones of said equal distance gaps for creating diagonal wirings of varying lengths from said diagonal wiring portions;

a first insulating layer disposed atop said first layer of wirings; and rectangular wiring means, disposed on said first insulating layer, for electrically interconnecting said circuit cells through said first layer of wirings, said rectangular wiring means including a first plurality of wirings substantially aligned with selected ones of said first lines and further including a second plurality of wirings substantially aligned with selected ones of said second lines, said first plurality of wirings, said second plurality of wirings and said diagonal wirings of varying lengths providing electrical connections between said plurality of wiring terminals of said circuit cells, said diagonal wirings of varying lengths being connectable to said rectangular wiring means via through holes disposed in said first insulating layer.

2. The semiconductor integrated circuit of claim 1 wherein each of said adjacent colinear diagonal wiring portions pass through diagonally adjacent said intersection points and are separated by a predetermined gap.

3. The semiconductor circuit of claim 1 wherein each of said diagonal wiring portions pass through one of said intersection points, each said diagonal wiring portion bisecting at least two rectangular frame portions.

4. The semiconductor integrated circuit of claim 1 wherein said diagonal wiring portions are composed of impurity diffused layers.

5. The semiconductor integrated circuit of claim 1 wherein said diagonal wiring portions are composed of polycrystalline silicon.

6. The semiconductor integrated circuit of claim 1 wherein said rectangular wiring means comprises:
   a second layer of wirings, said second layer of wirings comprising said first plurality of wirings;
   a third layer of wirings, said third layer of wirings comprising said second plurality of wirings; and
   a second insulating layer disposed between said second layer and said third layer of wirings, said second insulating layer having a plurality of through holes to enable connection between said first plurality of wirings and said second plurality of wirings at selected said intersection points.

7. The semiconductor integrated circuit of claim 6 wherein said first plurality of wirings and said second plurality of wirings are composed of aluminum.

8. The semiconductor integrated circuit of claim 1 wherein said gap connector means electrically connects selected colinear adjacent diagonal wiring portions to create said diagonal wirings of varying lengths.

9. The semiconductor integrated circuit of claim 8 wherein said gap connector means includes gap contact wiring.

10. The semiconductor integrated circuit of claim 9 wherein said gap contact wiring is composed of aluminum.

11. A semiconductor integrated circuit formed on a substrate, comprising:
   a plurality of circuit cells;
   a wiring region disposed between said circuit cells, said wiring region having first and second substantially parallel edges, each said edge being juxtaposed with a said circuit cell, said wiring region being divided into a plurality of rectangular frame portions by a reference field, said reference field including a plurality of first lines, said first lines being substantially parallel to said first and second parallel edges and being equispaced apart, said reference field also including a plurality of second lines, said second lines being equispaced and orthogonally disposed with respect to said first lines, said first and second lines intersecting at a plurality of intersection points, said reference field including a plurality of diagonal lines bisecting said rectangular frame portions, said digonal lines passing through said intersection points, said diagonal lines being equispaced and parallel;
   a first layer of wirings, said first layer of wirings comprising a plurality of diagonal wiring portions, a set of diagonal wiring portions being disposed along each of said diagonal lines;
   gap connector means for creating diagonal wirings of varying lengths from sets of said diagonal wiring portions corresponding to selected ones of said diagonal lines;
   a first insulating layer disposed atop said first layer of wirings; and
   rectangular wiring means, disposed on said first insulating layer for electrically interconnecting said circuit cells through connections of said first layer of wirings and wiring in said rectangular wiring means.

12. The semiconductor integrated circuit of claim 11 wherein adjacent colinear ones of said diagonal wiring portions have equal distance gaps therebetween.

13. The semiconductor integrated circuit of claim 12 wherein each of said adjacent colinear diagonal wiring portions pass through diagonally adjacent said intersection points and are separated by a predetermined gap.

14. The semiconductor circuit of claim 11 wherein each of said diagonal wiring portions pass through one of said intersection points, each said diagonal wiring portion bisecting at least two rectangular frame portions.

15. The semiconductor integrated circuit of claim 11 wherein said diagonal wiring portions are composed of impurity diffused layers.

16. The semiconductor integrated circuit of claim 11 wherein said diagonal wiring portions are composed of polycrystalline silicon.

17. The semiconductor integrated circuit of claim 11 wherein said rectangular means comprises a first plurality of wirings substantially aligned with selected ones of said first lines and further including a second plurality of wirings substantially aligned with selected ones of said second lines, said first plurality of wirings, said second plurality of wirings and said diagonal wirings of varying lengths providing electrical connections between said circuit cells, said diagonal wirings of varying lengths being connectable to said rectangular wiring means via through holes disposed in said first insulating layer.

18. The semiconductor integrated circuit of claim 17 wherein said rectangular wiring means comprises:
   a second layer of wirings, said second layer of wirings comprising said first plurality of wirings;
   a third layer of wirings, said third layer of wiring comprising said second plurality of wirings; and
   a second insulating layer disposed between said second layer and said third layer of wirings, said second insulating layer having a plurality of through holes to enable connection between said first plurality of wirings and said second plurality of wirings at selected said intersection points.

19. The semiconductor integrated circuit of claim 18 wherein said first plurality of wirings and said second plurality of wirings are composed of aluminum.

20. The semiconductor integrated circuit of claim 19 wherein said gap connector means electrically connects selected colinear adjacent ones of said diagonal wiring portions to create said diagonal wirings of varying lengths.

21. The semiconductor integrated circuit of claim 20 wherein said gap connector means includes a gap contact wiring.

22. The semiconductor integrated circuit of claim 21 wherein said gap contact wiring is composed of aluminum.

23. A semiconductor integrated circuit formed on a substrate comprising:
   a plurality of circuit cells, each of said circuit cells having a plurality of wiring terminals;
   a wiring region disposed between said circuit cells, said wiring region having first and second substantially parallel edges, each said edge being juxtaposed with a said circuit cell, said wiring region being divided into a plurality of rectangular frame portions by a reference field, said reference field including a plurality of first lines, said first lines being substantially parallel to said first and second parallel edges and being equispaced apart, said reference field also including a plurality of said lines, said second lines being equispaced and orthogonally disposed with respect to said first lines, said first and second lines intersecting at a plurality of intersection points, said reference field including a plurality of diagonal lines bisecting said rectangular frame portions, said diagonal lines passing through said intersection points, said diagonal lines being equispaced and parallel;

a first layer of wirings, said first layer of wirings comprising a plurality of diagonal wiring portions, a set of diagonal wiring portions being disposed along each of said diagonal lines, with adjacent colinear ones of said diagonal wiring portions in each set of diagonal wiring portions having equal distance gaps therebetween, said diagonal wiring portions of each set of diagonal wiring portions being connectable to provide diagonal wirings of varying lengths for connecting said circuit cells.

24. The semiconductor integrated circuit of claim 23 wherein said diagonal wiring portions are connectable together by bridging said equal distance gaps to form diagonal wirings of varying lengths, said diagonal wirings of varying lengths being connectable to additional wirings extending in said first or second directions to electrically connect said circuit cells.

25. The semiconductor integrated circuit of claim 23 further comprising:

gap connector means disposed in selected ones of said equal distance gaps for creating diagonal wirings of varying lengths from said diagonal wiring portions, said gap connector means including a gap contact wiring; and rectangular wiring means disposed on said first insulating layer for electrically interconnecting said circuit cells through said first layer of wirings, said rectangular wiring means including a first plurality of wirings composed of aluminum substantially aligned with selected ones of said first lines and further including a second plurality of wirings composed of aluminum substantially aligned with selected ones of said second lines, said first plurality of wirings, said second plurality of wirings and said diagonal wirings of varying lengths providing electrical connections between said plurality of wiring terminals of said circuit cells, said diagonal wirings of varying lengths being connectable to said rectangular wiring means via through holes disposed in said first insulating layer.

26. The semiconductor integrated circuit of claim 25, wherein each of said adjacent colinear diagonal wiring portions pass through diagonally adjacent intersection points.

27. The semiconductor integrated circuit of claim 26 wherein said diagonal wiring portions are composed of impurity diffused layers.

28. The semiconductor integrated circuit of claim 27 wherein said diagonal wiring portions are composed of polycrystalline silicon.

29. The semiconductor integrated circuit of claim 26 wherein said rectangular wiring means comprises:

a second layer of wirings, said second layer of wirings comprising said first plurality of wirings;

a third layer of wirings, said third layer of wirings comprising said second plurality of wirings; and a second insulating layer disposed between said second layer and said third layer of wirings, said second insulating layer having a plurality of through holes to enable connection between said first plurality of wirings and said second plurality of wirings at selected said intersection points.

30. The semiconductor integrated circuit of claim 29 wherein said gap connector means electrically connects selected colinear adjacent diagonal wiring portions to create said diagonal wirings of varying lengths.

31. The semiconductor integrated circuit of claim 30 wherein said gap contact wiring is composed of aluminum.

32. The semiconductor circuit of claim 25 wherein each of said diagonal wiring portions pass through one of said intersection points, each said diagonal wiring portion bisecting at least two rectangular frame portions.

33. The semiconductor integrated circuit of claim 32 wherein said diagonal wiring portions are composed of impurity diffused layers.

34. The semiconductor integrated circuit of claim 32 wherein said diagonal wiring portions are composed of polycrystalline silicon.

35. The semiconductor integrated circuit of claim 32 wherein said rectangular wiring means comprises:

a second layer of wirings, said second layer of wirings comprising said first plurality of wirings;

a third layer of wirings, said third layer of wirings comprising said second plurality of wirings; and a second insulating layer disposed between said second layer and said third layer of wirings, said second insulating layer having a plurality of through holes to enable connection between said first plurality of wirings and said second plurality of wirings at selected said intersection points.

36. The semiconductor integrated circuit of claim 35 wherein said gap connector means electrically connects selected colinear adjacent diagonal wiring portions to create said diagonal wirings of varying lengths.

37. The semiconductor integrated circuit of claim 36 wherein said gap contact wiring is composed of aluminum.

38. A semiconductor integrated circuit formed on a substrate comprising:

a plurality of circuit cells, each of said circuit cells having a plurality of wiring terminals;

a wiring region disposed between said circuit cells, said wiring region having first and second substantially parallel edges, each said edge being juxtaposed with a said circuit cell, said wiring region being divided into a plurality of rectangular frame portions by a reference field, said reference field including a plurality of first lines, said first lines being parallel to said first and second substantially parallel edges and being equispaced apart, said reference field also including a plurality of second lines, said second lines being equispaced and orthogonally disposed with respect to said first lines, said first and second lines intersecting at a plurality of intersection points;

a first layer of wirings, said first layer of wirings comprising a plurality of diagonal wiring portions extending diagonally across said reference field and passing through said intersection points, with adjacent colinear diagonal wiring portions having equal distance gaps therebetween;

gap connector means disposed in selected ones of said equal distance gaps for creating diagonal wirings of varying lengths from said diagonal wiring portions;

a first insulating layer disposed atop said first layer of wirings; and rectangular wiring means, disposed on said first insulating layer for electrically interconnecting said circuit cells together with said first layer of wirings, said rectangular wiring means including a first plurality of wirings substantially aligned with selected ones of said first lines and further including a second plurality of wirings substantially aligned with selected ones or said second lines, said first plurality of wirings of said second plurality of wirings, and said diagonal wirings of varying lengths providing electrical connections between selected ones of said plurality of wiring terminals of said circuit cells, said diagonal wirings being connectable to said rectangular wiring means via through holes disposed in said first insulating layer.

39. The semiconductor integrated circuit of claim 38 wherein said adjacent colinear diagonal wiring portions pass through diagonally adjacent intersection points and are separated by a predetermined gap.

40. The semiconductor circuit of claim 38 wherein each of said diagonal wiring portions pass through one of said intersection points, each said diagonal wiring portion bisecting at least two rectangular frame portions.

41. The semiconductor integrated circuit of claim 38 wherein said diagonal wiring portions are composed of impurity diffused layers.

42. The semiconductor integrated circuit of claim 38 wherein said diagonal wiring portions are composed of polycrystalline silicon.

43. The semiconductor integrated circuit of claim 38 wherein said rectangular wiring means comprises:

a second layer of wirings, said second layer of wirings comprising said first plurality of wirings;

a third layer of wirings, said third layer of wirings comprising said second plurality of wirings; and a second insulating layer disposed between said second layer and said third layer of wirings, said second insulating layer having a plurality of through holes to enable connection between said first plurality of wirings and said second plurality of wirings at selected said intersection points.

44. The semiconductor integrated circuit of claim 43 wherein said first plurality of wirings and said plurality of wirings are composed of aluminum.

45. The semiconductor integrated circuit of claim 38 wherein said gap connector means electrically connects selected colinear adjacent diagonal wiring portions to create said diagonal wirings of varying lengths.

46. The semiconductor integrated circuit of claim 45 wherein said gap connector means includes a gap contact wiring.

47. The semiconductor integrated circuit of claim 46 wherein said gap contact wiring is composed of aluminum.

* * * * *